United States Patent [19]
Noguchi

[11] Patent Number: 5,627,086
[45] Date of Patent: May 6, 1997

[54] METHOD OF FORMING THIN-FILM SINGLE CRYSTAL FOR SEMICONDUCTOR

[75] Inventor: Takashi Noguchi, Kanagawa, Japan

[73] Assignee: Sony Corporation, Tokyo, Japan

[21] Appl. No.: 438,792

[22] Filed: May 11, 1995

Related U.S. Application Data

[62] Division of Ser. No. 164,807, Dec. 10, 1993, abandoned.

[30] Foreign Application Priority Data

Dec. 10, 1992 [JP] Japan .................................. 4-330523

[51] Int. Cl.$^6$ .......................... H01L 21/322; H01L 21/84
[52] U.S. Cl. .......................... 438/162; 438/164; 438/407; 438/479; 438/486; 117/8
[58] Field of Search .................................. 437/19, 21, 24, 437/173, 174, 233, 46, 109, 907, 908, 967, 973, 40 TFT, 41 TFT, 924; 117/8, 10, 43, 44, 904; 148/DIG. 182, DIG. 90–93, DIG. 1, DIG. 102

[56] References Cited

U.S. PATENT DOCUMENTS

| | | | |
|---|---|---|---|
| 3,900,345 | 8/1975 | Lesk | 437/24 |
| 4,814,292 | 3/1989 | Sasaki et al. | 148/DIG. 1 |
| 4,904,611 | 2/1990 | Chiang et al. | 437/46 |
| 5,264,383 | 11/1993 | Young | 437/40 |
| 5,283,205 | 2/1994 | Sakamoto | 437/924 |
| 5,290,712 | 3/1994 | Sato et al. | 437/24 |
| 5,318,661 | 6/1994 | Kumomi | 117/8 |
| 5,352,291 | 10/1994 | Zhang et al. | 117/8 |
| 5,457,058 | 10/1995 | Yonehara | 437/24 |

FOREIGN PATENT DOCUMENTS

| | | | |
|---|---|---|---|
| 58-56467 | 4/1983 | Japan | 437/21 |
| 60-105216 | 6/1985 | Japan | 437/174 |
| 61-261286 | 11/1986 | Japan | |
| 63-310109 | 12/1988 | Japan | 437/973 |
| 3-250728 | 11/1991 | Japan | 437/233 |
| 3-280434 | 12/1991 | Japan | 437/21 |
| 4-120721 | 4/1992 | Japan | 437/967 |
| 4-139728 | 5/1992 | Japan | 437/40 TF |
| 4-255213 | 9/1992 | Japan | 437/46 |

OTHER PUBLICATIONS

T. Noguchi, et al., J. Electrochem. Soc., 134(7) (1987) (1771) "Polysilicon Film Obtained by Si$^+$ Implant. and Annealing".
Y.Y. Wang et al., SPIE, vol. 530 (1985) 70 "The Influence of Ion Implantation on SPE of a–Si . . . ".
M.K. Hatalis et al., J. Appl. Phys., 63,(7) (1988) 2260 "Polysilicon by Low Temp. Annealing of LPCVD a–Si Films".
S. Wolf & R.N. Tauber, "Silicon Processing for the VLSI Era" vol. 1, 1986, p. 179.
I.–W. Wu, et al., J. Appl. Phys., 65(10) (1989) 4036 "Retardation of Nucleation Rate by Si Implant. of LPCVD a–Si".
P. Revesz, et al., J. Appl. Phys., 49(10) (1978) 5199 "Epitaxial Regrowth of Ar–Implanted a–Si".
Translation of JP 4–255213 (Hamada).

Primary Examiner—Charles L. Bowers, Jr.
Assistant Examiner—Leon Radomsky
Attorney, Agent, or Firm—Hill, Steadman & Simpson

[57] ABSTRACT

A thin-film semiconductor crystal is formed by depositing a thin film of amorphous silicon on a substrate, introducing ions selectively into a predetermined region of the thin film of amorphous silicon, and growing a single semiconductor crystal in the thin film of amorphous silicon by way of solid-phase crystal growth. A semiconductor device which employs the thin-film semiconductor crystal has a channel in the region where the ions are selectively introduced.

6 Claims, 3 Drawing Sheets

METHOD OF FORMING THIN-FILM SINGLE CRYSTAL FOR SEMICONDUCTOR

This is a division of application Ser. No. 08/164,807, filed Dec. 10, 1993, abandoned.

BACKGROUND OF THE INVENTION

1. Field of the Invention

The present invention relates to a method of forming a thin-film semiconductor crystal by forming a thin film of amorphous silicon, doping a selected region of the thin film of amorphous silicon with ions by way of ion implantation, and thereafter growing a single semiconductor crystal by way of low-temperature solid-phase growth, and a semiconductor device with such a thin-film semiconductor crystal.

2. Description of the Related Art

Static random-access memories (SRAMs) of the high-resistance-load type fabricated using a semiconductor film deposited on a substrate comprise load-type memory cells that are fabricated of a polycrystalline semiconductor, i.e., polycrystalline silicon. However, it is difficult for the SRAMs of the high-resistance-load type to maintain sufficient levels of operating margin, reliability, standby current.

To solve the above problem, there has been proposed a laminated SRAM using, as load elements, thin-film transistors formed in a polycrystalline semiconductor of highly uniform film qualities, e.g., polycrystalline silicon.

Thin-film transistors find use as image element drivers in liquid crystal display units, for example.

Polycrystalline silicon contains dangling bonds at a higher density than single-crystal silicon which are responsible for a leak current at the time the transistor is turned off and for a low operating speed at the time the transistor is turned off.

One way of reducing such dangling bonds is to dope the polycrystalline silicon with hydrogen for coupling the dangling bonds with hydrogen atoms. It is important to grow polycrystalline silicon with good film qualities having few crystal defects for improved characteristics.

There have generally been proposed chemical vapor deposition (CVD), solid-phase crystal growth (SPC), etc. for growing polycrystalline silicon.

The solid-phase crystal growth process allows fabrication of a polycrystalline semiconductor film of a large grain size of 1 μm or greater. If a thin-film transistor is formed on such a large crystal grain, then it possible that it has a large current driving capability with a low current leakage.

However, since the position of the crystal grain grown by the solid-phase crystal growth process is at random, the channel of the resultant thin-film transistor contains a grain boundary. Therefore, the current leakage may not be lowered and the current driving capability may not be increased, resulting in large variations of characteristics.

As a solution to the above problem, there has been proposed a crystal growth process capable of growing a crystal grain in a certain selected position (see, for example, H. Mumomi, et al. "Control of Grain-Location in Solid State Crystallization of Si", Extended Abstracts of the 22nd (1990 International) Conference on Solid State Devices and Materials, Sendai, 1990, pp 1159–1160, and Japanese laid-open patent publication No. 3-12542).

One conventional process will be described below with reference to FIGS. 1A through 1C of the accompanying drawings. As shown in FIG. 1A, a thin film 2 of polycrystalline silicon is deposited on a substrate 1 such as an $SiO_2$ layer using $SiH_4$ by low-pressure (LP) CVD, and then silicon ions are introduced at a low dose of $1 \times 10^{14} cm^{-2}$ at 40 KeV, for example, into the entire surface of the thin film 2 of polycrystalline silicon by ion implantation.

Thereafter, as shown in FIG. 1B, a mask 3 of a photoresist is formed selectively on the thin film 2 of polycrystalline silicon in regions where a single crystal is to be formed, by photolithography. Then, silicon ions are introduced at a high dose of $1 \times 10^{15} cm^{-2}$ at 40 KeV, for example, into the exposed or unmasked regions of the thin film 2 of polycrystalline silicon by ion implantation.

Subsequently, as shown in FIG. 1C, the mask 3 is removed, and the assembly is annealed for low-temperature solid-phase crystal growth. Crystal growth is now started in the thin film 2 of polycrystalline silicon from the regions where the ion concentration is lower, i.e., which were masked by the mask 3, forming a thin-film single semiconductor crystal 4 with grain boundaries 7. In this manner, the single semiconductor crystal can grown in a predetermined position.

The above crystal growth is based on the difference between incubation times for the generation of crystal nuclei due to different concentration of implanted ions (see, for example, J. Electrochem. Soc., SOLID-STATE SCIENCE AND TECHNOLOGY, July 1987, p 1775, FIG. 5). Since the incubation time for the generation of crystal nuclei in regions of a lower ion concentration is shorter than the incubation time for the generation of crystal nuclei in regions of a higher ion concentration, crystal nuclei are produced in the regions of a lower ion concentration, and the crystal starts growing from those crystal nuclei.

According to the above process, inasmuch as a thin-film single semiconductor crystal with a single crystal grain is formed in a determined position, a thin-film transistor fabricated in that position has its channel positioned out of the grain boundary. Therefore, the thin-film transistor thus fabricated has good characteristics.

However, the above process of forming a thin-film single semiconductor crystal requires a long processing time and a complex operation because it involves at least two ion implantation steps that are time-consuming and complicated.

OBJECTS AND SUMMARY OF THE INVENTION

It is a first object of the present invention to provide a method of growing a thin-film semiconductor crystal through a simplified ion implantation process for an improved throughput.

A second object of the present invention is to provide a method of growing a thin-film semiconductor crystal by reducing an annealing time for solid-phase crystal growth for an improved throughput.

A third object of the present invention is to provide a semiconductor device of high performance which employs a thin-film semiconductor crystal formed by the above method.

According the present invention, there is provided a method of growing a thin-film semiconductor crystal comprising the steps of depositing a thin film of amorphous silicon on a substrate, introducing ions selectively into a predetermined region of the thin film of amorphous silicon, and growing a single semiconductor crystal in the thin film of amorphous silicon by way of solid-phase crystal growth.

According to the present invention, there is also provided a semiconductor device comprising a substrate, a thin-film single crystal deposited on the substrate by introducing ions selectively into a film of amorphous silicon on the substrate and growing a crystal in the film of amorphous silicon by way of solid-phase crystal growth, and a gate disposed in the vicinity of the crystal nucleus of the thin-film single crystal.

According to the present invention, there is also provided a semiconductor device assembly comprising a substrate, a thin-film single crystal deposited on the substrate by introducing ions selectively into a plurality of regions of a film of amorphous silicon on the substrate and growing a crystal in each of the regions of the film of amorphous silicon by way of solid-phase crystal growth, and a plurality of gates disposed in the vicinity of the crystal nuclei of the regions of the thin-film single crystal.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

1st Embodiment

A process of forming a thin-film single semiconductor crystal according to a first embodiment of the present invention will be described below with reference to FIGS. 2A and 2B.

Figure 1A:
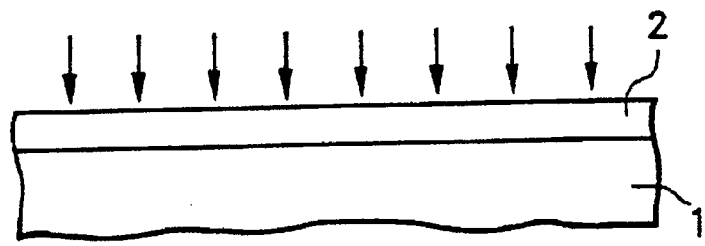
FIGS. 1A through 1C are fragmentary cross-sectional views showing a conventional process of forming a thin-film single semiconductor crystal.
Figure 1B:
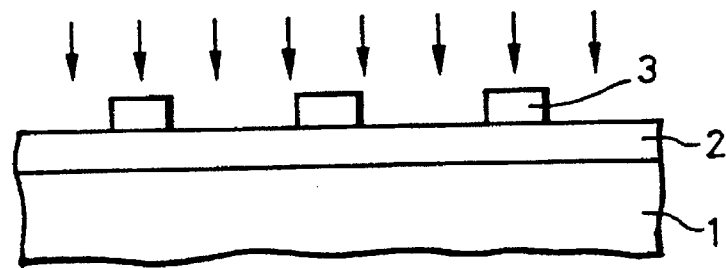
Figure 1C:
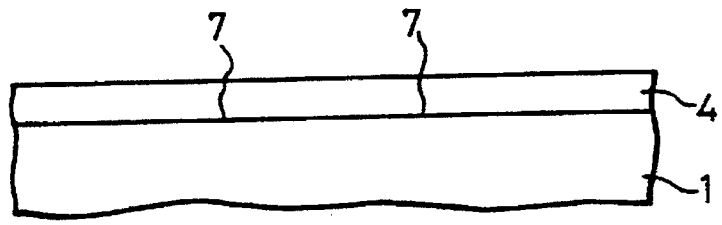
Figure 2A:
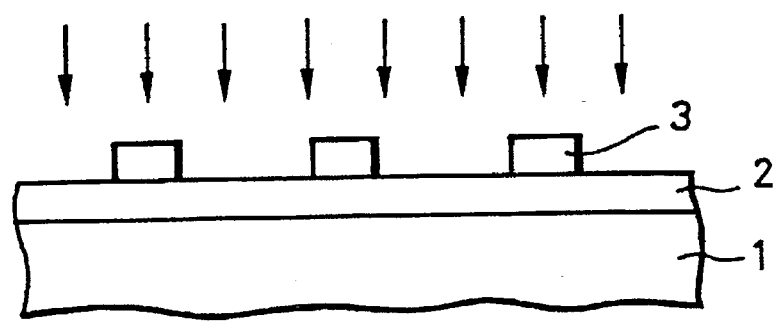
FIGS. 2A and 2B are fragmentary cross-sectional views showing a process of forming a thin-film single semiconductor crystal according to a first embodiment of the present invention.

As shown in FIG. 2A, a thin film 2 of amorphous silicon is deposited to a thickness of 40 nm, for example, on a substrate 1 by CVD at a low temperature of 540° C. or lower. Specifically, the thin film 2 of amorphous silicon is deposited using $SiH_4$ by low-pressure CVD at a temperature ranging from 500° C. to 540° C., or using $Si_2H_6$ by low-pressure CVD at a temperature ranging from 450° C. to 540° C., or by plasma CVD at a temperature of 100° C. or higher, preferably ranging from 200° C. to 540° C.

The substrate 1 may be an insulative substrate such as of quartz, or a substrate composed of an insulative layer of $SiO_2$ or the like deposited on a semiconductor substrate.

Then, a photoresist, for example, is coated on the entire surface of the thin film 2 of amorphous silicon, and patterned by photolithography or the like, producing a mask 3 having a stripe pattern or a grid pattern at spaced intervals of 20 μm, for example.

Then, ions are introduced by ion implantation into exposed regions of the thin film 2 of amorphous silicon which are not covered by the mask 3, at a dose ranging from $1.5 \times 10^{15} cm^{-2}$ to $5 \times 10^{15} cm^{-2}$, low enough not to impair the crystallinity. Specifically, the ions are preferably of a neutral element such as Si, Ar, Ne, Ca, or the like which will not affect the electric or chemical characteristics of a semiconductor that will eventually be fabricated.

Thereafter, the mask 3 is removed as by ashing.

Then, the assembly is preannealed for 2 hours or shorter in an $N_2$ atmosphere at a temperature, as of 550° C., which is lower than 600° C. so as not to cause solid-phase crystal growth and higher than the temperature at which the thin film 2 of amorphous silicon was deposited.

Subsequently, a low-temperature solid-phase crystal growth process is carried out in an $N_2$ atmosphere at a temperature of 600° C. or higher for a period of time ranging from 15 to 20 hours.

Figure 2B:
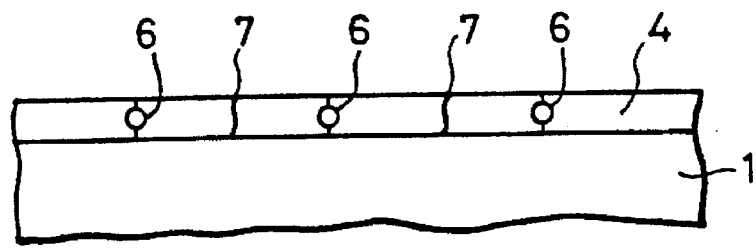

Since the incubation time for the generation of crystal nuclei in the regions of the thin film 2 of amorphous silicon where almost no ions are introduced, i.e., which were covered by the mask 3, is shorter, crystal nuclei 6 are first generated in those regions, starting to crystallize the thin film 2 of amorphous silicon into the other regions where the ions are introduced at a higher concentration, until finally a thin-film single semiconductor crystal 4 with grain boundaries 7 is formed, as shown in FIG. 2B. The thin-film single semiconductor crystal 4 is thus formed in a position determined by the mask 3 shown in FIG. 2A. The position of the thin-film single semiconductor crystal 4 (single crystal grain) is thus predetermined.

A thin MIS (metal-insulator-silicon) transistor, for example, is then fabricated on the thin-film single semiconductor crystal 4 according to a normal fabrication process.

The transistor thus fabricated has its channel positioned reliably out of the grain boundary, and hence suffers a low current leakage, is uniform in quality, and has high reliability.

According to the above process, the thin film 2 of amorphous silicon was deposited on the substrate 1 by CVD at a low temperature of 540° C. or lower, and a high dose of ions was selectively introduced by selective ion implantation into the thin film 2 of amorphous silicon for forming a thin-film single semiconductor crystal.

The dose of ions introduced in the selective ion implantation was $1.5 \times 10^{15} cm^{-2}$ or higher, and then, the assembly was preannealed at a temperature lower than 600° C. so as not to cause solid-phase crystal growth, prior to the annealing for subsequent solid-phase crystal growth. The incubation time for the generation of crystal nuclei, which was at least 16 hours heretofore, was reduced to 30 minutes to 15 hours. The annealing for subsequent solid-phase crystal growth, which was effected for about 30 hours heretofore, was reduced to 15 to 20 hours.

The thin-film single semiconductor crystal 4 thus formed was uniform in quality and excellent crystalline characteristics.

Since a high dose of ions is introduced only once into the thin film 2 of amorphous silicon and the annealing time of subsequent solid-phase crystal growth is shorter, the thin-film single semiconductor crystal 4 can be formed with improved productivity.

The thin-film single semiconductor crystal 4 has good film qualities and excellent crystalline characteristics, and is formed in a determined position, rather than at random. Consequently, if a semiconductor device, such as a thin-film transistor, is fabricated on the thin-film single semiconductor crystal 4, then it has a low current leakage and a high current driving capability, and is highly reliable in operation. The semiconductor device is suitable for use in SRAMs, liquid-crystal display units, or the like.

2nd Embodiment

A process of fabricating thin-film transistors using a thin-film single semiconductor crystal produced according to the first embodiment of the present invention will be described below with reference to FIGS. 3A through 3D.

According to the second embodiment, thin-film transistors are fabricated using the thin-film single semiconductor crystal, i.e., single-crystal semiconductor film, 4 which has been formed by the process according to the first embodiment described above.

Figure 3A:
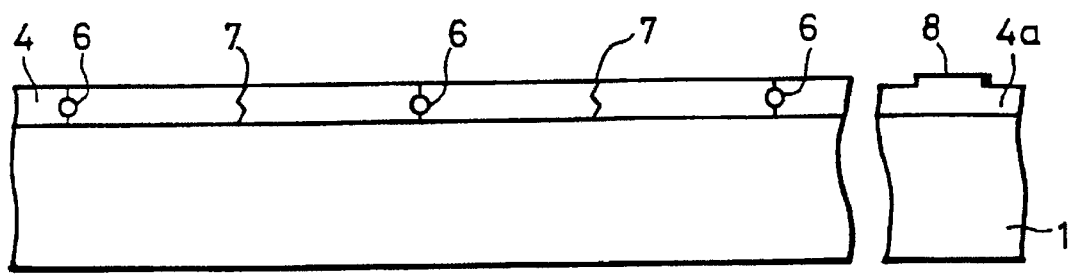
FIGS. 3A through 3D are fragmentary cross-sectional views showing a process of fabricating thin-film transistors using a thin-film single semiconductor crystal produced according to the first embodiment of the present invention.

As shown in FIG. 3A, an alignment mark 8 is formed in the form of a raised step having a height of about 0.05 μm on a region 4a of the semiconductor film 4 by photolithography and RIE (reactive ion etching). The RIE is carried out in a gas atmosphere of $Cl_2$ and $O_2$ under 50 mTorr (6.66 Pa) with a power of 0.8 KW. Grain boundaries 7 are developed in the semiconductor film 4 by crystal growth as shown in FIG. 3A.

Figure 3B:
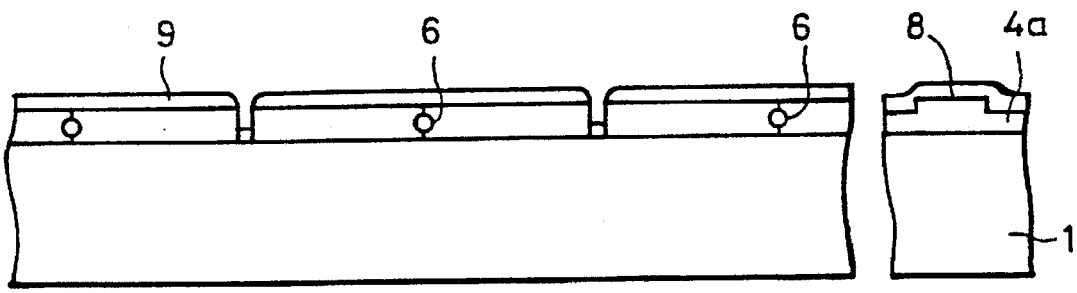

Then, as shown in FIG. 3B, single-crystal silicon regions around the respective crystal nuclei 6 are separated at spaced intervals of about 4 μm in the grain boundaries 7 in the semiconductor film 4 by photolithography and RIE using the alignment mark 8 as a reference. Thereafter, a gas of $SiH_4$ and $O_2$ is introduced to deposit a gate oxide film 9 to a thickness of about 0.1 μm on the separated single-crystal silicon regions at 400° C. by LPCVD.

Figure 3C:
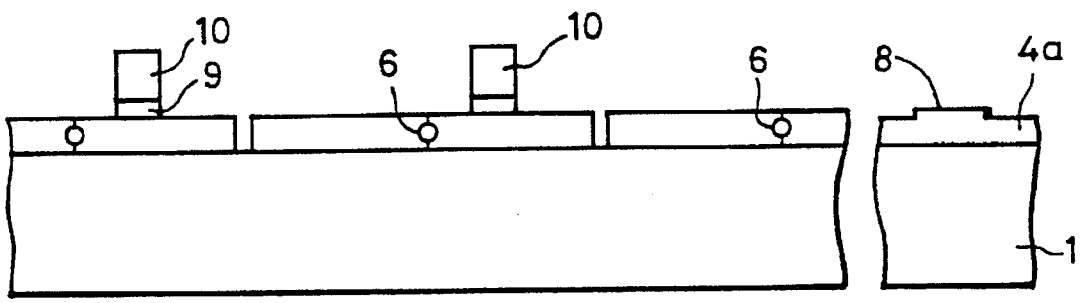

As shown in FIG. 3C, gate electrodes 10 each having a thickness of 0.3 μm are deposited on the entire gate oxide film 9 in the vicinity of the respective crystal nuclei 6 in a gas atmosphere $SiH_4$ and $PH_3$ at 500° C. by LPCVD, and patterned by photolithography and RIE. At the same time, the gate oxide film 9 is removed.

Figure 3D:
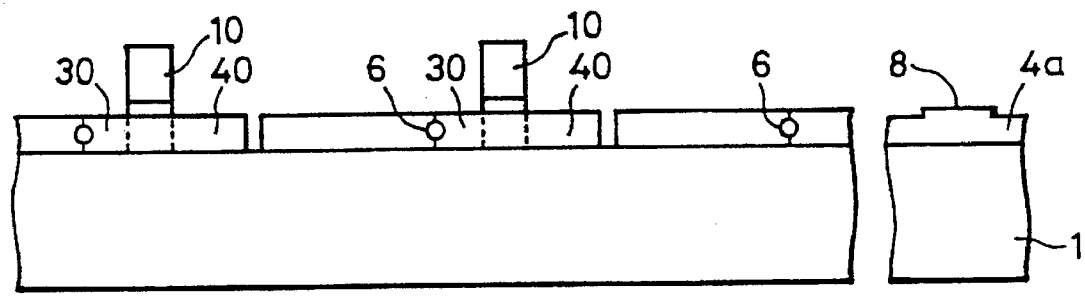

Thereafter, $P^+$ ions are introduced into the single-crystal silicon regions at a dose of $2\times10^{15}$ cm$^{-2}$ at 40 KeV by ion implantation, forming source regions 30 and drain regions 40. The assembly is then annealed in $N_2$ at 600° C. for 20 hours, forming source and drain layers as shown in FIG. 3D.

An oxide film is then deposited to a thickness of about 0.5 μm by CVD, and contact holes for the source and drain layers are defined by photolithography and RIE in a gas atmosphere of $CHF_3$ and $O_2$ under 50 retort (6.66 Pa) with a power of 1.2 KW. Silicon-doped aluminum is thereafter deposited to a thickness of about 1.0 μm on the surface so far by sputtering, and patterned into electrodes by photolithography and RIE in a gas atmosphere of $BCl_3$ and $Cl_2$ under 50 mTorr (6.66 Pa) with a power of 0.8 KW, thus fabricating thin-film transistors (not shown).

Representative electric characteristics of the thin-film transistors thus fabricated and conventional thin-film transistors are given in the following table:

| | μ cm²/V · S | S value mV/dec |
|---|---|---|
| Conventional Example | 140 | 93 |
| Inventive Example | 430 | 61 |

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A method of growing a thin-film semiconductor crystal comprising the steps of:

depositing a thin film of amorphous silicon on a substrate;

covering a plurality of separate first regions of the amorphous silicon with a mask;

introducing ions selectively into a plurality of separate second regions on said thin film of amorphous silicon, said amorphous silicon being substantially free of implanted ions prior to said step of introducing ions selectively; and growing a large crystal grain in each of said plurality of separate first regions of said thin film of amorphous silicon by solid-phase crystal growth and such that grain boundaries are formed in each of said plurality of separate second regions;

forming an alignment mark prior to forming said large crystal grains;

separating said separate first regions by removing said plurality of separate second regions containing said grain boundaries using the alignment mark as a reference; and forming a device in each first region.

2. A method according to claim 1, wherein said thin film of amorphous silicon is deposited by chemical vapor deposition at a temperature of 540° C. or lower.

3. A method according to claim 1, further comprising the step of:

after the ions are introduced and before the large crystal grains are grown by way of solid-phase crystal growth, annealing said thin film of amorphous silicon at a temperature lower than 600° C.

4. A method according to claim 1, wherein said ions are introduced at a dose of $1.5\times10^{15}$cm$^{-2}$ or higher.

5. The method of forming a thin-film semiconductor of claim 1, further comprising the step of forming a transistor over at least one of said large crystal grains.

6. The method of forming a thin-film semiconductor of claim 1, further comprising the step of forming a transistor over each of said large crystal grains.

\* \* \* \* \*